(12) United States Patent
Marino et al.

(10) Patent No.: US 7,259,583 B2
(45) Date of Patent: Aug. 21, 2007

(54) METHODS AND APPARATUS FOR TESTING POWER GENERATORS

(75) Inventors: Charles James Marino, Sloansville, NY (US); Stephen Lawrence Burroughs, Schuylerville, NY (US); Bernard William Traver, Ballston Lake, NY (US); David Richard Berling, Burlington, KY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/897,691

(22) Filed: Jul. 23, 2004

(65) Prior Publication Data

US 2006/0028234 A1 Feb. 9, 2006

(51) Int. Cl.
*G01R 31/34* (2006.01)

(52) U.S. Cl. ..................................................... 324/772

(58) Field of Classification Search ................ 324/772, 324/158.1, 765; 310/215, 551, 140–144, 310/198, 201, 284
See application file for complete search history.

(56) References Cited

U.S. PATENT DOCUMENTS

| | | | |
|---|---|---|---|
| 3,551,784 A * | 12/1970 | Shaw et al. ................... 322/90 |
| 4,152,640 A * | 5/1979 | Craig .......................... 324/546 |
| 4,219,748 A * | 8/1980 | Sakaguchi et al. ............ 310/71 |
| 4,543,503 A | 9/1985 | Kaminski et al. |
| 4,580,325 A | 4/1986 | Wiersema et al. |
| 4,584,497 A | 4/1986 | Butman, Jr. et al. |
| 4,621,850 A | 11/1986 | Wiersema et al. |
| 4,678,931 A | 7/1987 | Olsen et al. |
| 5,155,441 A * | 10/1992 | Zelm .......................... 324/551 |
| 5,421,077 A | 6/1995 | Zayechek et al. |
| 5,432,391 A | 7/1995 | Zawoysky |
| 5,581,869 A | 12/1996 | Travaly |
| 6,191,510 B1 * | 2/2001 | Landin et al. ................. 310/51 |
| 6,553,665 B2 | 4/2003 | Gunn et al. |
| 6,603,227 B2 * | 8/2003 | Rose, Sr. ...................... 310/74 |

* cited by examiner

*Primary Examiner*—Ha Tran Nguyen
*Assistant Examiner*—Tung X. Nguyen
(74) *Attorney, Agent, or Firm*—Armstrong Teasdale LLP

(57) ABSTRACT

A method for testing a generator including a plurality of phase groups is provided. The method includes electrically isolating a first phase group from remaining phase groups by substantially encapsulating at least a portion of a plurality of stator bars electrically coupled together within the first phase group with an insulative member, electrically grounding at least a second phase group, and inducing a high voltage to the first phase group to facilitate proof testing the first phase group.

5 Claims, 2 Drawing Sheets

METHODS AND APPARATUS FOR TESTING POWER GENERATORS

BACKGROUND OF THE INVENTION

This invention relates generally to electrical power generators and more particularly, to methods and systems for testing electrical components in electrical power generators.

In at least some known generators, a stator yoke in the generator surrounds an armature core and partially encloses a plurality of armature windings, which are sometimes referred to as stator windings or stator bars. At least some known stator windings are formed with a plurality of copper conductors that are wound in the armature to form loops. More specifically, the armature windings are arranged in such a manner to enable a desired voltage and current characteristics to be generated during operation. A plurality of hollow individual conductors, or strands inside the stator bars enable cooling water to be channeled within the stator bars.

Electrical insulation is wrapped around the stator bars electrically to isolate the stator bars from each other. The insulation facilitates preventing arcing between the windings, and also shields the bars from foreign objects that could electrically short the bars. However, the insulating properties of the insulation may degrade if the insulation becomes damp or is damaged. Voltage arcs may occur from the armature bars through degraded regions or wet regions of the insulation. Over time, continued operation with arcs may prematurely shorten the useful life of the generator.

To facilitate extending the useful life of the generator, the stator bars may be periodically tested. Within at least some known tests, groups of stator bars are "tied together" electrically and tested as a set, while the remaining bars are electrically grounded. More specifically, insulation is used to isolate the groups under test from the groups that are grounded to prevent electrical discharge or arcing between these groups. During at least some known tests, high-voltage blankets fabricated from rubber are positioned between the groups to facilitate electrically isolating adjacent groups from one another. However, known blankets may be difficult to use because of their size, shape, and weight, and may frequently not prevent arcing. When arcing occurs, the test is considered a failure and is stopped to prevent damage to the generator. Additional insulation is then installed in the area of the arcing and the test is re-performed. The process may need to be repeated several times before a successful test for the group under test may be performed at the required voltage level.

BRIEF DESCRIPTION OF THE INVENTION

In one aspect, a method for testing a generator including a plurality of phase groups is provided. The method includes electrically isolating a first phase group from remaining phase groups by substantially encapsulating at least a portion of a plurality of stator bars electrically coupled together within the first phase group with an insulative member, electrically grounding at least a second phase group, and inducing a high voltage to the first phase group to facilitate proof testing the first phase group.

In another aspect, a method for testing a generator during a rewind process is provided. The method includes electrically isolating a first phase group being rewound by substantially encapsulating at least a portion of a plurality of stator bars electrically coupled together within the first phase group with an insulative member, coupling at least a second phase group to an electrical ground, and supplying a high voltage to the first phase group to facilitate proof testing the first phase group.

In a further aspect, a method for testing a plurality of stator bars of a generator is provided. The method includes coupling an insulative tubular member around at least a portion of each stator bar coupled together within the first group of stator bars, coupling a second group of stator bars to an electrical ground, and coupling the first phase group to a voltage source.

DETAILED DESCRIPTION OF THE INVENTION

Figure 1:
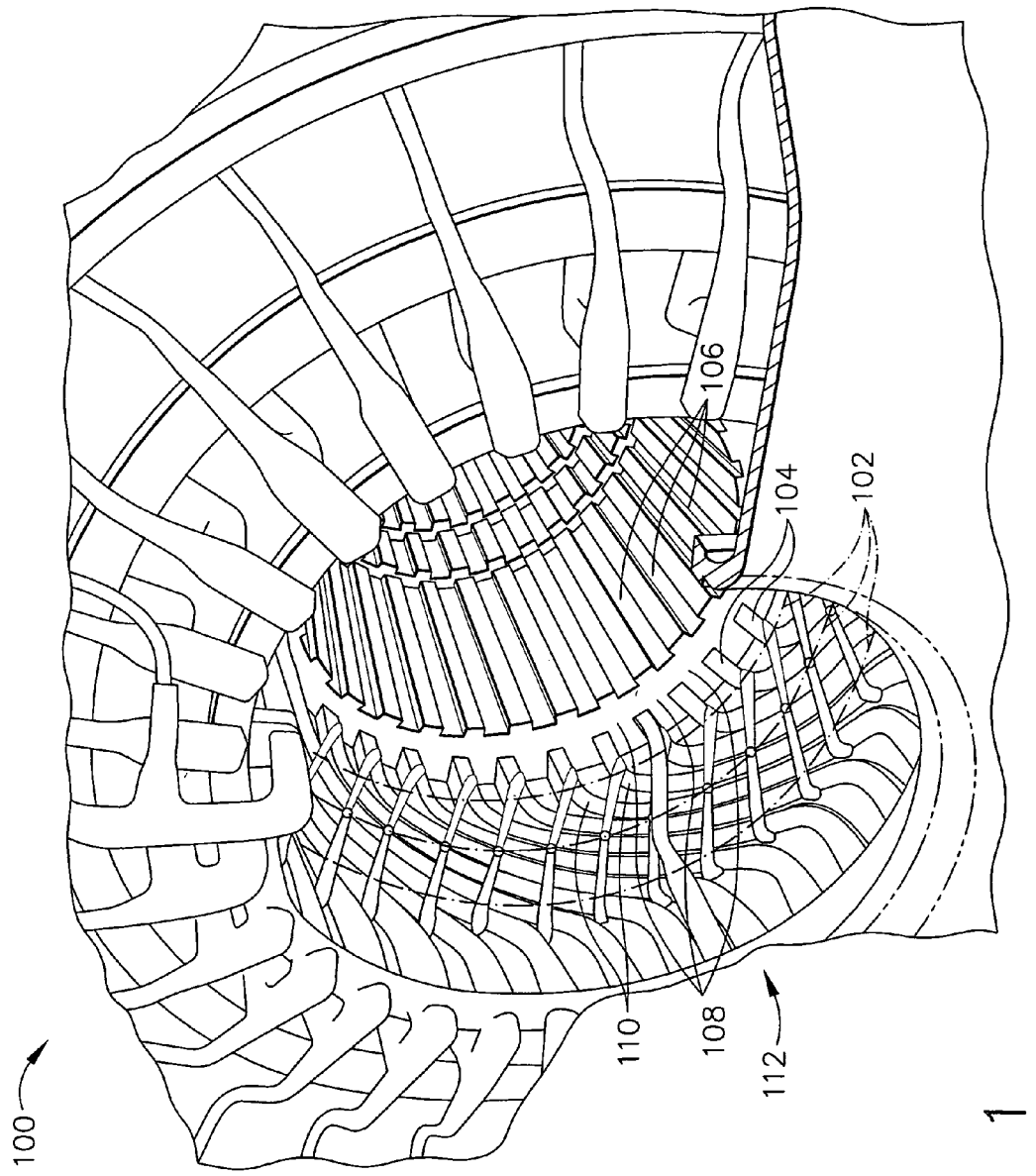
FIG. 1 is a perspective end view of an exemplary generator.
Figure 2:
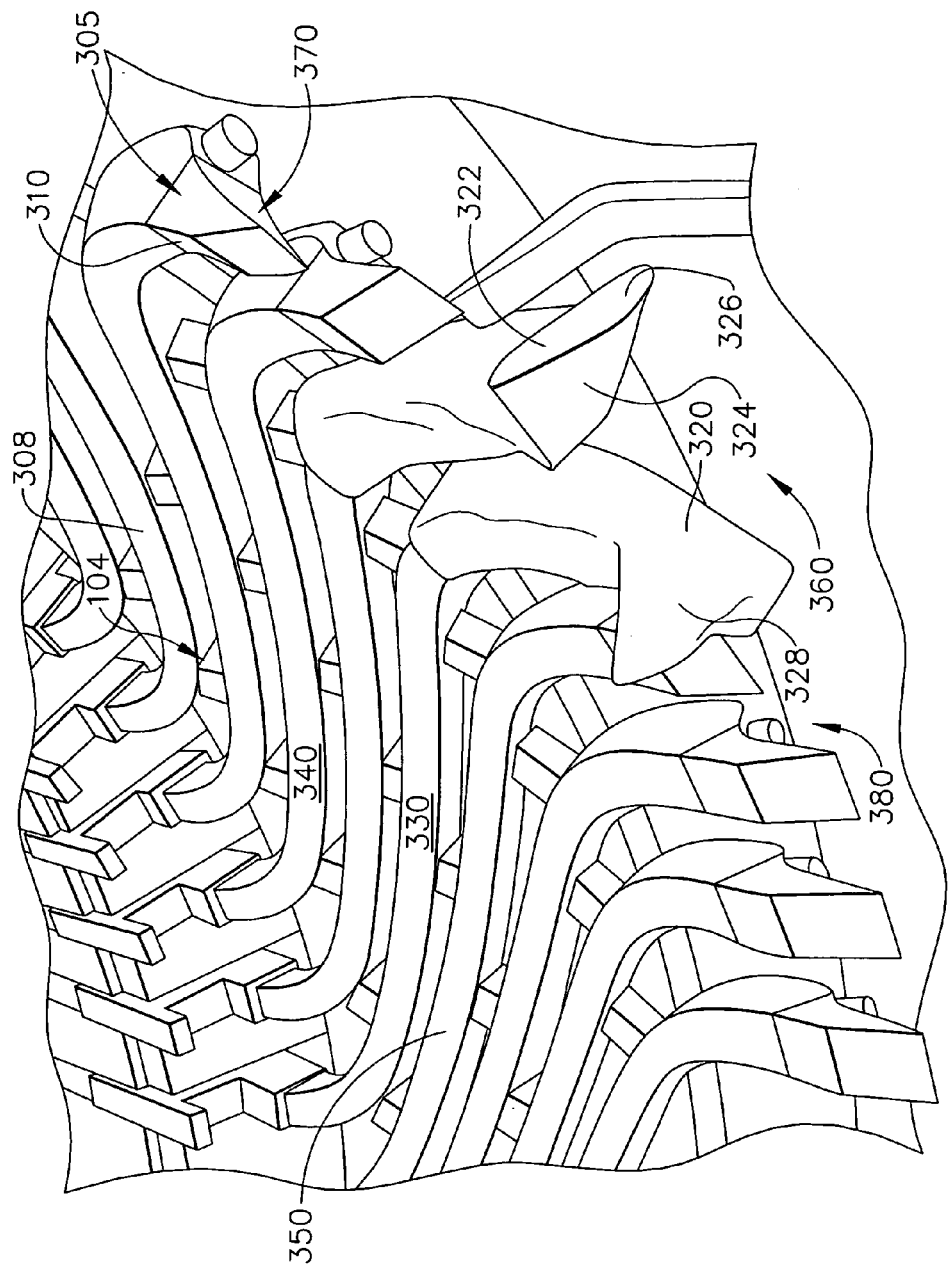
FIG. 2 is a perspective end view of the generator shown in FIG. 1 during a testing procedure.

FIG. 1 is a perspective end view of an exemplary generator 100. A rotor 102 is transparently represented by dashed lines. FIG. 2 is a perspective end view of generator 100 during a testing procedure. A plurality of stator bar windings 104 are positioned in slots 106 defined around an inner circumference of a stator core 108. More specifically, each stator bar winding 104 includes at least one circumferential bend 110 defined between a turbine end 112 and a generator end (not shown) of each winding 104. Bends 110 are the portion of each stator bar winding 104 that may be most susceptible to insulation wetting. In the exemplary embodiment, stator bars windings 104 are formed from a plurality of flat bar conductors or stator bars 305 that are coupled together prior to form to a pre-determined winding path through winding 104. In one embodiment, stator bars 305 are fabricated from copper. Conductor ends 310 are electrically connected together to form each winding of generator 100. Stator bar windings 104 are covered with electrical insulation 308, except for a conductor end 310 which remains exposed.

An insulative tubular member 320 is coupled over the exposed conductor ends 310 of stator bar windings 104 being tested. Tubular member 320 includes an inner surface 322, an outer surface 324, and a cavity 326 defined therein. In the exemplary embodiment, tubular member 320 is high-voltage shrink tubing fabricated from a polyolefin-based material. More specifically, tubular member 320 is slidably coupled over stator bar winding ends 310 such that member 320 remains in an "un-shrunk" condition.

At various stages during a full or a partial rewind of generator 100, high voltage testing is performed to facilitate ensuring stator bar insulation 308 has not sustained damage that may compromise its dielectric strength. More specifically, the testing is conducted on individual stator bar windings 104, or in phase groups of stator bar windings 104, such that the windings 104 being tested are electrically isolated by tubular members 320 from those windings 104 not being tested. As one group is coupled to a voltage source and tested, the remaining groups are electrically connected to ground for safety reasons. This process continues until all phase groups have been tested.

During testing, tubular member 320 facilitates electrically isolating each stator bar winding 104 being tested from those not currently being tested. More specifically, each tubular member 320 is slidably coupled around each winding 104 such that the plurality of stator bars 305 within that particular winding 104 are substantially encapsulated within tubular member cavity 326. Accordingly, tubular member 320 substantially circumscribes winding conductor end 310 and is coupled to each respective windings 104 without the use of any mechanical fasteners. Once coupled in position, tubular member 320 substantially electrically isolates each respective stator winding conductor end 310 from other winding conductor ends 310. In the exemplary embodiment, end 328 of each member 320 is folded over to substantially encapsulate the respective stator winding conductive end 310. In an alternative embodiment, tubular member 320 includes a sealed or closed end.

During testing, at least one stator bar winding 104, or a phase group of stator bar windings 104, are identified for testing. Accordingly, a first stator bar winding 330, which will be coupled to a voltage source (not shown) and tested, is adjacent or proximate to a second stator bar winding 340, which will not be tested. At least one tubular member 320 is then coupled to that respective stator bar conductor end 310 to substantially electrically insulate stator bars 305 within first stator bar winding 330 from stator bars 305 coupled within adjacent stator bar windings 340. In the exemplary embodiment, at least one stator bar winding 350 that is being tested is electrically coupled to ground. Tubular member 320 substantially prevents arcing between first stator bar winding 330 and adjacent stator bar windings 340 or 350.

The above-described tubular member allows for temporary insulation for high voltage testing conducted on electrical generators. More specifically, the shape of the tubular member allows tubular member to be slipped over stator bar easily and conveniently. As a result, a tubular member is provided which substantially electrically isolates windings being tested from those not being tested in a cost-effective and reliable means.

Exemplary embodiments of methods for testing generators are described above in detail. The systems are not limited to the specific embodiments described herein, but rather, components of each assembly may be utilized independently and separately from other components described herein. Each generator component can also be used in combination with other rotor and stator bar components.

While the invention has been described in terms of various specific embodiments, those skilled in the art will recognize that the invention can be practiced with modification within the spirit and scope of the claims.

What is claimed is:

1. A method for testing a generator including a plurality of phase groups, said method comprising:
   electrically isolating a first phase group from remaining phase groups by substantially encapsulating at least a portion of a plurality of exposed stator bar conductive ends electrically coupled together within the first phase group with an insulative member that is removably coupled around and substantially circumscribes at least a portion of each of the plurality of exposed stator bar conductive ends within the first phase group;
   electrically grounding at least a second phase group; and
   inducing voltage to the first phase group to facilitate proof testing the first phase group.

2. A method in accordance with claim 1 wherein electrically isolating a first phase group further comprises slidably and removably coupling the insulative member around at least a portion of the plurality of exposed stator bar conductive ends electrically coupled together within the first phase group.

3. A method in accordance with claim 1 wherein electrically isolating a first phase group further comprises removably coupling the insulative member to the plurality of exposed stator bar conductive ends coupled within the first phase group to facilitate preventing arcing between the second phase group and the first phase group.

4. A method in accordance with claim 1 wherein electrically isolating a first phase group further comprises removably coupling shrink tubing to the plurality of exposed stator bar conductive ends electrically coupled together within the first phase group.

5. A method is accordance with claim 4 wherein removably coupling shrink tubing to the plurality of exposed stator bar conductive ends electrically coupled together within the first phase group further comprises removably coupling the shrink tubing to the plurality of exposed stator bar conductive ends within first phase group such that the shrink tubing remains in an un-shrunk condition.

\* \* \* \* \*

UNITED STATES PATENT AND TRADEMARK OFFICE
CERTIFICATE OF CORRECTION

PATENT NO.        : 7,259,583 B2                                          Page 1 of 1
APPLICATION NO.   : 10/897691
DATED             : August 21, 2007
INVENTOR(S)       : Charles James Marino et al.

It is certified that error appears in the above-identified patent and that said Letters Patent is hereby corrected as shown below:

On the Title page of the patent, Item [75] in the Inventors, after "David Richard Berling, Burlington, KY (US)", insert therefor -- Brock Lape, Clifton Park, NY (US) --.

Signed and Sealed this

Sixteenth Day of June, 2009

JOHN DOLL
*Acting Director of the United States Patent and Trademark Office*